United States Patent
Shevchenko

(10) Patent No.: US 12,406,108 B2
(45) Date of Patent: Sep. 2, 2025

(54) RADIUS BASED NEURAL NETWORK OPERATIONS ON SETS OF POINTS

(71) Applicant: NEURAL CONCEPT SA, Lausanne (CH)

(72) Inventor: Artem Shevchenko, Lausanne (CH)

(73) Assignee: NEURAL CONCEPT SA, Lausanne (CH)

( * ) Notice: Subject to any disclaimer, the term of this patent is extended or adjusted under 35 U.S.C. 154(b) by 585 days.

(21) Appl. No.: 17/920,387

(22) PCT Filed: Apr. 21, 2020

(86) PCT No.: PCT/IB2020/053759
§ 371 (c)(1),
(2) Date: Oct. 20, 2022

(87) PCT Pub. No.: WO2021/214516
PCT Pub. Date: Oct. 28, 2021

(65) Prior Publication Data
US 2023/0161924 A1 May 25, 2023

(51) Int. Cl.
*G06F 30/15* (2020.01)
*G06F 30/27* (2020.01)

(52) U.S. Cl.
CPC .............. *G06F 30/15* (2020.01); *G06F 30/27* (2020.01)

(58) Field of Classification Search
None
See application file for complete search history.

(56) References Cited

U.S. PATENT DOCUMENTS

| | | | | |
|---|---|---|---|---|
| 6,447,448 | B1* | 9/2002 | Ishikawa | A61B 5/036 600/377 |
| 11,715,565 | B2* | 8/2023 | Hafez | G06N 5/01 600/300 |
| 11,797,842 | B2* | 10/2023 | Chu | G06F 16/285 |
| 2006/0047655 | A1* | 3/2006 | Peter | G06F 16/2465 |
| 2007/0276723 | A1* | 11/2007 | Samid | G06N 5/04 705/12 |
| 2012/0063387 | A1* | 3/2012 | Chen | H04W 40/246 370/328 |
| 2014/0114975 | A1* | 4/2014 | Rouat | G06N 5/022 707/737 |

(Continued)

FOREIGN PATENT DOCUMENTS

WO 2019/048085 3/2019

*Primary Examiner* — Hasanul Mobin
(74) *Attorney, Agent, or Firm* — Maschoff Brennan

(57) ABSTRACT

In a trained artificial neural network, a first data set is projected to a second data set. The first data set includes a first set of first points belonging to cells in a metric space. The second data set includes a second set of second points. The first points are associated with first sets of values. At least one anchor point is defined for a respective second point. Cells satisfying a given proximity condition with respect to a respective anchor point are selected. The first points of the selected cells within a distance from the respective anchor point are selected. A second set of values for the respective second point is determined based on the first sets of values. The second data set is formed by associating the determined second sets of values with the second points so that one second set of values is allocated per second point.

24 Claims, 4 Drawing Sheets

(56) References Cited

U.S. PATENT DOCUMENTS

| | | | |
|---|---|---|---|
| 2016/0027208 A1* | 1/2016 | Pham | G06T 7/66 |
| | | | 382/103 |
| 2018/0349695 A1* | 12/2018 | Le Henaff | G06F 18/22 |
| 2019/0251467 A1* | 8/2019 | Lokare | G06F 17/16 |
| 2019/0266404 A1* | 8/2019 | Spivack | G06V 20/35 |
| 2020/0159445 A1* | 5/2020 | Kachare | G06F 3/0655 |
| 2020/0175306 A1* | 6/2020 | Onoro-Rubio | G06N 3/045 |
| 2020/0176082 A1* | 6/2020 | Massingham | G16B 30/00 |
| 2020/0211189 A1* | 7/2020 | Yip | G06V 20/69 |
| 2020/0257317 A1* | 8/2020 | Musk | G05D 1/686 |
| 2023/0161924 A1* | 5/2023 | Shevchenko | G06F 30/27 |
| | | | 706/15 |

* cited by examiner

RADIUS BASED NEURAL NETWORK OPERATIONS ON SETS OF POINTS

TECHNICAL FIELD

The present invention relates to a method in a trained artificial neural network of projecting a first data set, representing e.g. shape in a metric space, to a second data set. More specifically, the method uses a grid structure in the metric space to speed up the projection. The projection may implement query-ball-based or fixed-radius-based neural network computations, such as convolution, pooling, etc. on a first set of points or point clouds comprised in the first data set. The invention also relates to a computer program product and an apparatus with which the method can be implemented.

BACKGROUND OF THE INVENTION

Shapes of a device or object can be discretised into a set of points along the contour of the device forming a point cloud, or into an interconnected set of points forming a surface mesh. The shapes may represent many types of different objects, such as vehicles or vehicle parts. More specifically, examples of such objects are aeroplanes, cars and turbines. Such objects may be technical devices adapted to be exposed to a fluid, such as air or water, flowing around its contour. An artificial neural network may then be employed to optimise the shape of the device by using the point cloud or the mesh as an input to the artificial neural network. Alternatively, or in addition, some parameters may be computed for the shape based on the point cloud or mesh and based on some additional features, such as environmental parameters, which may for instance describe the properties of the liquid flowing around the object. Such computed parameters may for instance be lift, drag or pressure applied to the object.

Most known neural-network-based approaches of processing point clouds use k-nearest neighbours (kNN) approaches, since these approaches allow storing (often pre-computed) point neighbourhoods in fixed-size arrays. Some approaches first project every individual feature on a grid and then perform operations on this grid. Some approaches discard location information altogether. Some other known methods are based on query-ball approaches. However, the known methods have the shortcoming that they fail to efficiently implement neural network operations on sets of points or point clouds. For example, as far as the kNN approaches are concerned, they are not robust in non-uniform sampling settings, i.e., when the points in the point cloud are non-uniformly distributed. The distance at which they operate (when measured from a given anchor point in the point cloud) depends on the local density of the point cloud. If a point cloud is very dense in a given region, then the k nearest neighbours of a point will span a very small area. If the point cloud is very sparse in another area, they will span a much larger area. This non-uniformity leads to poorer performance than a query-ball approach (fixed radius). However, traditional query-ball approaches also have some limitations. More specifically, some methods require checking against all the points in the input point cloud, which is highly inefficient. Furthermore, in most methods, the output point cloud is equal to the input point cloud, which does not allow for projection onto different surface or volume representations. Moreover, most methods use pre-computed neighbourhoods, which is inefficient in terms of memory, and this forces one to have anchor points that are fixed during the training phase. This eliminates adaptive methods, in particular those in which the locations of the anchor points are learned during the training phase.

SUMMARY OF THE INVENTION

It is an object of the present invention to overcome at least some of the problems identified above. Thus, the invention aims to provide an efficient implementation for performing neural network operations on data sets comprising sets of points.

According to a first aspect of the invention, there is provided a computer-implemented method in a trained artificial neural network of projecting a first data set comprising a first set of points to a second data set comprising a second set of points as recited in claim 1.

The present invention thus proposes an accurate method performing operations on sets of points and thus on point clouds and/or surface meshes by dividing the metric space into cells. When performing operations on a set of points, thanks to the cell structure of the point space, only certain points need to be considered for a given operation. The method may also be based on a query-ball neighbourhood approach (as opposed to a kNN based approach) in a way that it is (i) efficient enough to allow for on-the-fly calculation, and it is (ii) memory-efficient for graphics processing unit (GPU) calculations.

This above goal is thus achieved by using an index structure over the metric space, which according to one example allows finding efficiently the points inside the query ball around arbitrary anchor points. In this way, only a limited number of neighbouring points need to be checked against anchor points, which allows the method to scale linearly with the overall size of the point cloud, and with the radius of the query ball. The gain is all the more significant if the radii of the query balls are small compared to the extent of the whole point cloud. By virtue of the above, for instance convolution or pooling layers or operations thus obtained can be integrated into deep neural networks and run on GPUs for efficient training and inference.

To speed up the creation of the index structure, a shared memory of a GPU may be used. Because the shared memory is on-chip, the shared memory is much faster than a global memory. In fact, shared memory latency is roughly hundred times lower than uncached global memory latency. The speed-up comes at a price of restriction of number of cells in index structure so that that "number of cells along x-dimension"×"number of cells along y-dimension"×"number of cells along z-dimension"×"size of (integer)"≤"size of shared memory" (one integer per cell).

According to a second aspect of the invention, there is provided a non-transitory computer program product comprising instructions for implementing the steps of the method according to the first aspect of the present invention.

According to a third aspect of the invention, there is provided an apparatus or artificial neural network arranged to carry out the method according to the first aspect of the present invention.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which.

DETAILED DESCRIPTION OF AN EMBODIMENT OF THE INVENTION

Figure 1:
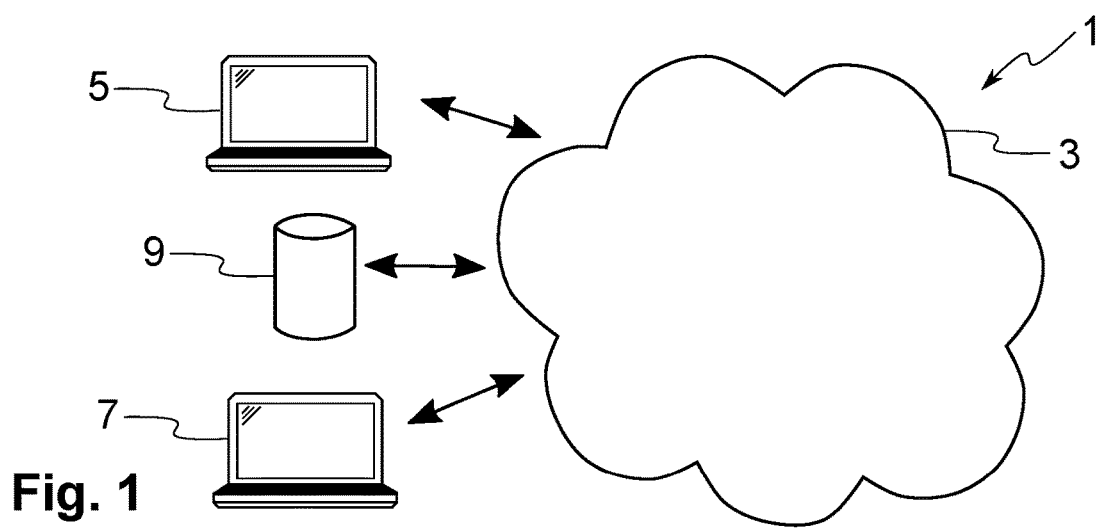
FIG. 1 is a simplified block diagram schematically illustrating a system where the teachings of the present invention may be applied.

An embodiment of the present invention will now be described in detail with reference to the attached figures. This non-limiting embodiment is described in the context of a set of points, which may in this example be considered as a point cloud characterising a shape of an object, which may be an aircraft wing for instance. However, the teachings of the present invention are not limited to this context. The below description refers to point clouds on several occasions, which are to be interpreted broadly in the present context. The meaning of "point clouds" is to be understood to be a set of points in an N-dimensional space, where N may be any positive integer depending on the application. The teachings below may also be applied to meshes, which differ from point clouds in that meshes, in addition to points, also comprise connections between points in the point space. Meshes may for instance be handled so that the meshes would first be converted into point clouds (i.e., and thus the adjacency information could be discarded in the subsequent processing), and then the teachings below could be applied to the point clouds. Furthermore, the words "point cloud" and "set of points" may often be used interchangeably. In the present description, a data set is understood to mean a collection of data. In the specific examples below, by a data set is understood a collection of data comprising or consisting of a set of points (or more specifically their locations in a point space), and a set of values associated with the points, and optionally also one or more input features. A set of values is understood to be a data array, a vector or a list of values comprising one or more values. Identical or corresponding functional and structural elements which appear in the different drawings are assigned the same reference numerals.

The present embodiment relates to performing neural network (NN) operations, such as convolutions and pooling, on point clouds, with at least some of the following requirements:

1) The NN input point cloud and the NN output point cloud may differ. For example, the output point cloud may be equal to the input point cloud, or it may partially overlap with the input point cloud (i.e., some points be overlap), or it may be a subset or a superset or the input point cloud, or it may be fully distinct from the input point cloud.

This is useful in particular because one may want the network to produce outputs at locations which do not correspond to the locations of the input points. For example, the input of the NN may be a 3D representation of an object's surface, and the output may be a volumetric pressure field, or a pressure field on the surface of another object. It is to be noted that most methods in the literature require the output point cloud and the input point cloud to be equal.

2) The input and output point clouds are located in a common metric space (i.e., points have positions within the space, and distances between two points can be computed so that the distance between two distinct points is positive, and the distance from a point to itself is zero).

3) Irregular point clouds can be handled. For this reason, the present invention uses according to one example a query-ball approach rather than a k-nearest-neighbour (kNN) based approach (as is most often done in the literature).

4) The operation can be performed efficiently, in order for it to be realised on-the-fly. On-the-fly computation is useful for several reasons:

In a query-ball approach, the number of neighbours of a given point may be very large (e.g. several thousands). On-the-fly methods allow for large number of neighbours without exploding in memory. Recomputing is beneficial in order to avoid running out of memory for large point clouds.

The points around which neighbourhoods are selected, also referred to as anchor points, can move during the training process. For example, in the case of Gaussian filters with learnable centres, the anchor points may be dependent on the positions of the centres of the Gaussians. Therefore, as the training of the NN progresses, the neighbourhood around anchor points may need to be updated.

Similarly, different inputs will result in different point clouds with different neighbourhoods. At training stage, on-the-fly methods avoid the need to pre-compute neighbourhoods for an entire training set (which may take up significant disk space). It is to be noted that most methods in the literature rely on fixed neighbourhoods, which are pre-computed.

5) In the context of geometric neural networks, the operation should be suitable for parallel hardware, and in particular for a GPU device.

The operation should allow making an implementation that use parallel architecture, i.e., be easily parallelisable by making parallel processing of output point cloud or anchor points, the features, etc. This allows a major improvement in performance.

FIG. 1 illustrates in a simplified manner a system 1, where the teachings of the present invention can be applied. The system comprises an artificial intelligence system 3, which in this example is an artificial neural network (ANN), and more specifically a convolutional neural network (CNN). Convolutional networks can be considered neural networks that use convolution (which is a linear operation) in place of general matrix multiplication in at least one of their layers. A CNN comprises an input layer and an output layer, as well as multiple hidden layers. The hidden layers of a CNN typically comprise a series of convolutional layers that convolve with a multiplication or other dot product. The activation function is typically a rectifier linear unit, and is subsequently followed by additional convolutions, such as pooling layers, fully connected layers and normalisation layers. The trained NN 3 is trained such that the trained NN 3 provides an accurate estimation of given experimental and/or simulated quantities when applied to given training data, wherein the given experimental and/or simulated quantities have been pre-computed by an external experiment and/or simulation.

The system also comprises a first data processing device 5 and a second data processing device 7, which may both be computers. The first data processing device 5 is in this example used to train the neural network 3 by using a training data set, while the second data processing device 7 may be an end user device, which may be used to show the outcome of the operations performed by the NN to the user. FIG. 1 also shows a post-processing device or unit 9 for post-processing output data from the NN 3. However, the post-processing unit 9 could instead be part of the NN 3.

Figure 2:
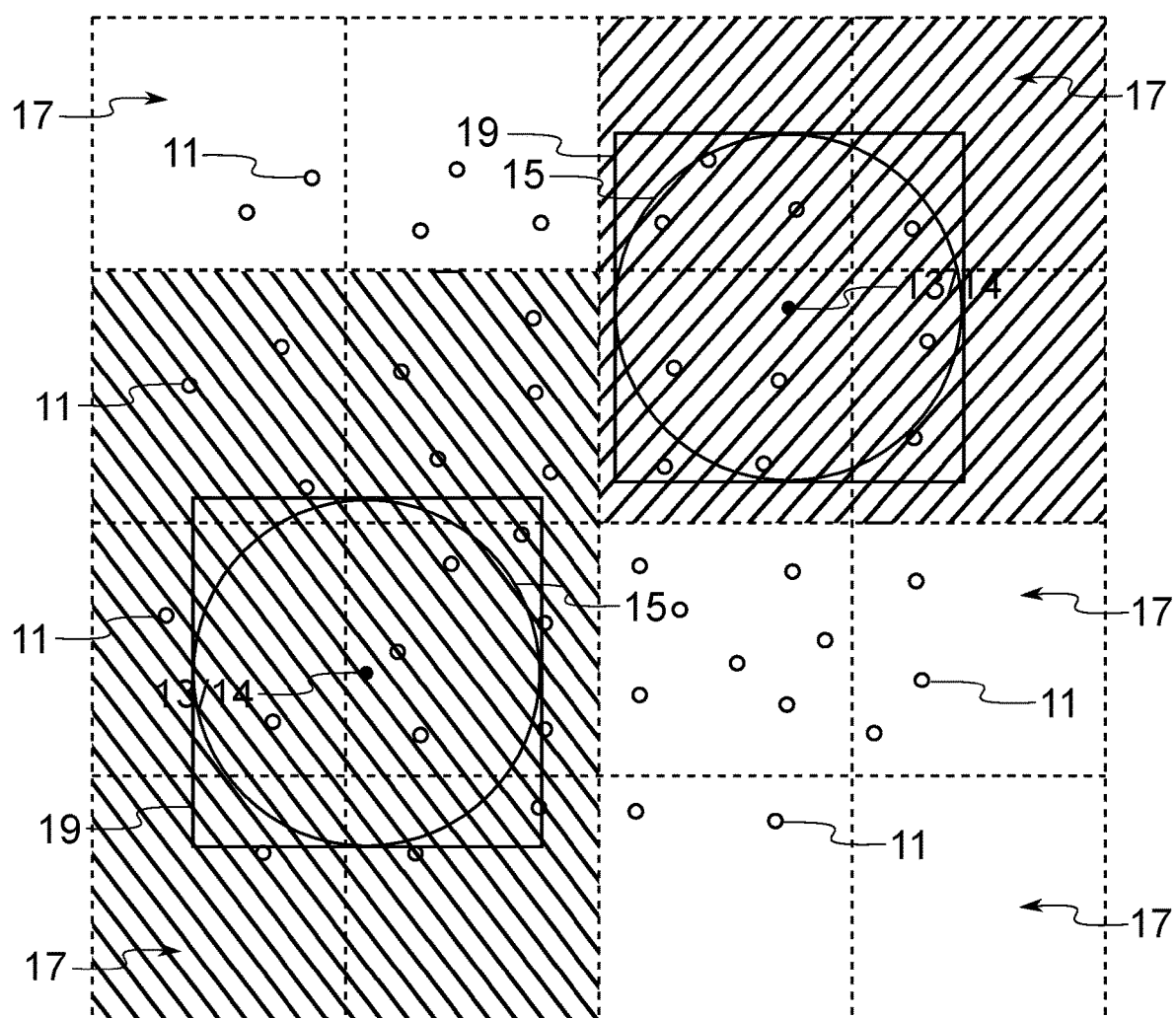
FIG. 2 shows a point space and how it can be divided into cells in order to make operations on points more efficient in neural networks.

The proposed method is based on defining two sets of points, namely a first set of points comprising first points 11 and a second set of points comprising second points 13. The first points are shown in FIG. 2 with white fill, while the second points are shown with black fill. It is to be noted that a given arbitrary object can be discretised using a predefined number of points chosen uniformly or non-uniformly along the contour of the object. Although, the uniformity of the points along the contour of the object is not necessary, doing so is often found to make the CNN execute faster and/or more accurately. The first set of points 11 has features or feature values associated with them and they collectively form a first data set or a portion of a first data set. One first set of values is thus associated with any given first point, where any set of values may include one or more values. These features may describe any given property associated with or characterising the respective point and/or its neighbourhood. This property may be for instance the colour of the point, the curvature or steepness around the point, etc. The second set of points can be a subset of the first points but not necessarily. Furthermore, the result of a respective operation of the NN will be assigned to the respective point in the second set of points to form a second data set or a portion of a second data set. In the present example, all point coordinates are given in the form of Euclidean coordinates. It is to be noted that the most familiar metric space is the three-dimensional Euclidean space.

The first and second sets of points, or more specifically the locations of the first and second points in the point space are defined before running the present method as explained below. In other words, the locations of these points are predefined externally, in general, but not necessarily, by the user, optionally for each layer of the NN 3. In this example, input data of a given layer of the NN comprise: (i) the first set of points with features associated with them and optionally also some other additional input data or information, referred to as input features (the additional data may also be considered to be part of the first data set); and (ii) the locations of the second points. In this example, the additional data are not associated with any specific (first) points but could be e.g. one more general or global parameters describing operational or environmental conditions around the object. Furthermore, as explained later in more detail, output data of a given layer (which may then be used as input data for a following or next layer) comprise the locations of the second points, and a second set of values determined by the NN at the locations of these points. In other words, the output of a given layer is a given set of second points with values associated with the second points.

For each second point, one or more anchor points 14 are defined. In FIG. 2, for simplicity, there is one single anchor point 14 for each second point 13, and the locations of the anchor points are the same as, or they coincide with the locations of the second points. However, the locations of the anchor points can be different from the locations of the second points. Furthermore, more than one anchor point may be associated with some or all of the second points. The user may select the locations of the anchor points or at least their initial locations, which may then evolve when running the method. Alternatively, the NN 3 or one of the data processing devices may define the locations of the anchor points, which may initially be selected randomly.

In the present example, a query ball 15 is defined and drawn around each anchor point in the metric space, and thus the anchor points have query balls around them. The simplified example of FIG. 2 shows two anchor points 14 such that each anchor point is surrounded by its dedicated query ball. In this example, the query balls have a given radius, which at a given time instant is the same for all the query balls in the point cloud. In other words, the radius of the query ball is advantageously kept fixed for any given layer of the NN 3. However, the radius could instead be fixed for the entire NN. Alternatively, or in addition, the radius could be made dependent on a respective anchor point location. This means that one anchor point could define a first radius, while a second anchor point could define a second, different radius, etc. Thus, each query ball defines a neighbourhood for its associated anchor point. However, as the process carried out by the NN progresses, the radius may evolve, i.e., it may become smaller or larger. The aim according to the present example is to find, for each anchor point, the first points 11 which lie within the corresponding ball in an efficient way.

To avoid checking all the points in the point cloud or point space (a portion of which is shown in FIG. 2) and to speed up the overall computation, the present invention uses an index structure. More specifically, this structure divides or separates the space into cells 17 or partition compartments, which allow the NN 3 to check only the first points 11 which are located inside the cells which overlap with the query ball 15 associated with a given anchor point 14. The set of such cells may thus be determined so that the set consists of cells that have an intersection or overlap with the respective query ball. To simplify the determination, in this example, a bounding box 19, which in this example has a rectangular shape, is drawn around the respective query ball 15 so that the bounding box 19 tightly encapsulates the respective query ball. The computation involved can be easily carried out if the cells constitute a uniform partition of the space. Accordingly, the division of the point space is in this example done uniformly along each dimension in the space. However, the division could instead by non-uniform. Also, at least some of the cells 17 could overlap with one or more other cells. Instead of selecting the cells 17 that overlap with the query ball 15, the cells could be selected by allocating indices to the cells and selecting the cells having a given proximity relationship with a respective anchor point index, such as the integer part of the location coordinate of the anchor point, determined by its location coordinate in the metric space. For example, if the anchor point has a location coordinate 2.8 along one dimension, then the neighbouring cells could be selected based on the integer part 2 of the location coordinate. More specifically, the cells having an index value equal to the integer part (2 in this example) and adjacent to the integer part (e.g., indices 1 and 3) could be selected in this simplified example.

Once the cell neighbourhood set has been defined, then the location of the respective anchor point is compared with the locations of each of the points inside the selected cells. The points whose distance to the respective anchor point 14 is below the radius associated with the anchor point (i.e., the radius of the respective query ball 15) are kept for the subsequent processing.

Once the above steps have been completed, then a desired processing operation is carried by using the features, or the values characterising these features, associated with the selected first points 11 and the obtained set of values is given or allocated to the respective anchor point. More specifically, the processing operation applied to the selected first points 11 may be at least one of the following operations: a convolution, filtering and pooling operation. The operation is carried out to aggregate the features of the selected points, and the aggregated set of values is allocated to the respective anchor point. The resulting values (i.e., feature values) are then associated with or allocated to the second point to which the anchor point(s) is/are associated (in the present example, the anchor points may be considered to be equal to the second points). If more than one anchor point is linked to a second point, then the sets of values of the anchor points may be aggregated e.g. in a similar manner as explained above when aggregating the values for the first points. For instance, the sets of values associated with the anchor points may be summed or an average may be taken of them, etc. It is to be noted that the pooling operation may be implemented in several manners, e.g. by max pooling or average pooling. They are carried out by assigning to the anchor points 14 feature values which are equal to the maximum of the corresponding feature values of all the associated first points 11 (max pooling) or by assigning to the anchor points 13 feature values which are equal to the average of the feature values of the corresponding feature values of all the associated first points 11 (average pooling). The convolution operation is carried out by assigning to the anchor points 14 feature values which are equal to the aggregation of the corresponding feature values at the associated first points 11 using weighted sum with several Gaussian distance-based functions as weights. The feature values can in this manner be calculated at every anchor point and then at every point in the second set of points based on the features, or more specifically their feature values, associated with the first set of points inside the respective query ball. It is to be noted that vector or array operations that are carried out during the aggregation process are typically point-wise operations. For example, the maximum (or minimum) of a vector is obtained by taking the maximum of the values element-wise. For example, the maximum of sets of values (i.e. vectors) [1, 2, 3] and [4, 2, 0] would thus be [4, 2, 3].

Typically, the processing as described above may be repeated a number of times as neural networks are composed of many such layers applied in sequence, interleaved with pointwise non-linear functions. The parameters of the layers are typically learned during the training process, for example, the values of the convolutional filter(s) applied to the first points in a neighbourhood, or how the anchor points relate spatially to the second points, etc.

The final product is a trained neural network, which can take as an input: (i) a first set of points (with associated features), such as a point cloud representation of a shape, and (ii) optionally some additional data (such as the velocity of the flow around the object), and outputs an accurate estimation of some physical quantity, such as the resulting pressure field on the object itself (which may be given at the locations of the second points of the last layer, unless the output of the last layer is postprocessed to modify the NN output), on some other object, or in a given volume, and optionally some aggregated quantities such as the drag and lift (when applied to a flying object), etc. The input point cloud formed by the first set of points, or more specifically its spatial distribution, may thus be the same as or different from the output point cloud formed by the second set of points (or its spatial distribution). The final information (the estimated quantities described above) can be either output to a user via a user interface, such as the second data processing device 7, or used as a means to select the most appropriate input shapes among a number of shapes (which may be either pre-defined, or generated based on the model's assessment of the shape).

Figure 3:
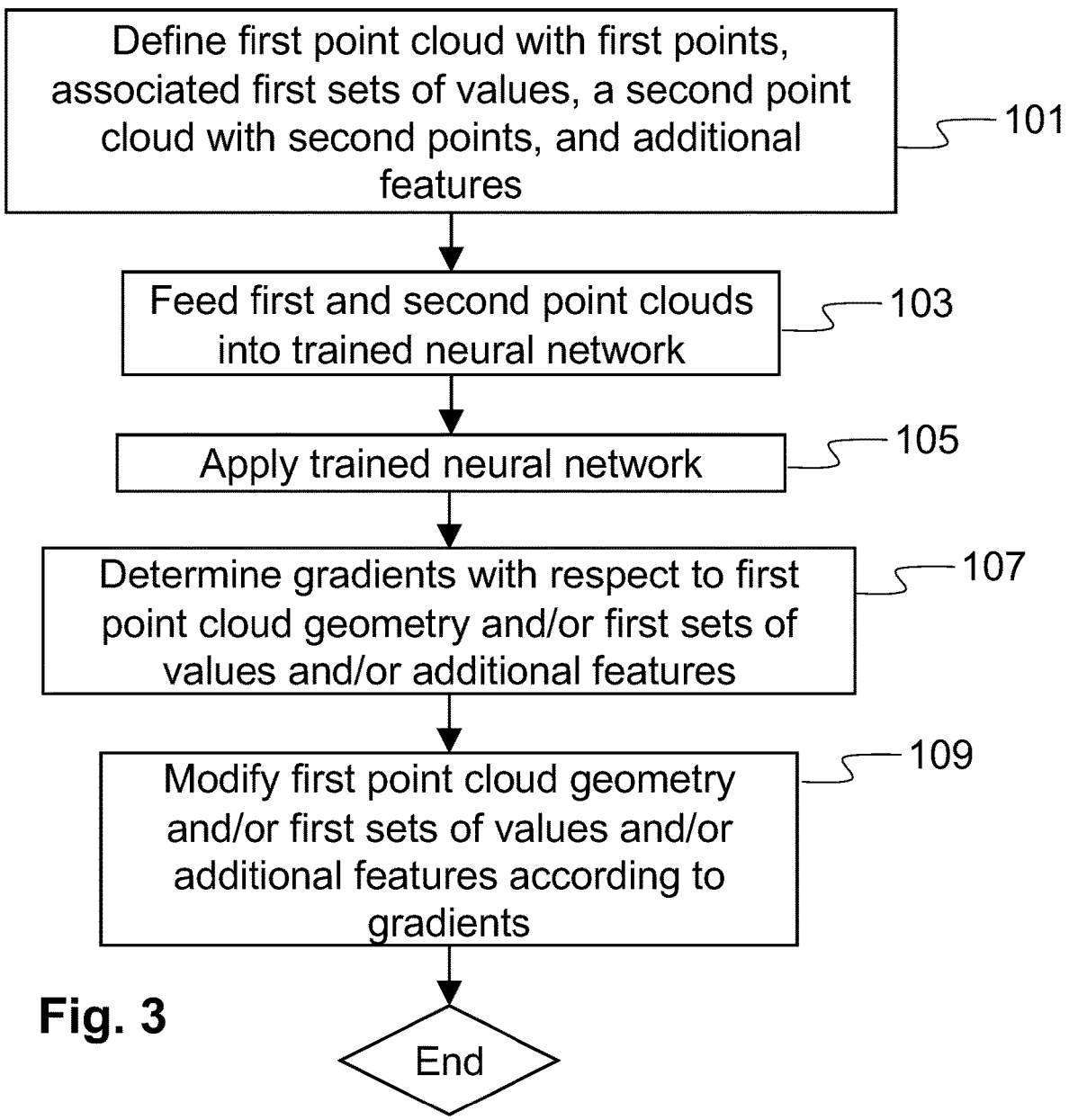
FIGS. 3 to 5 are flowcharts summarising the proposed method according to an example of the present invention.
Figure 4:
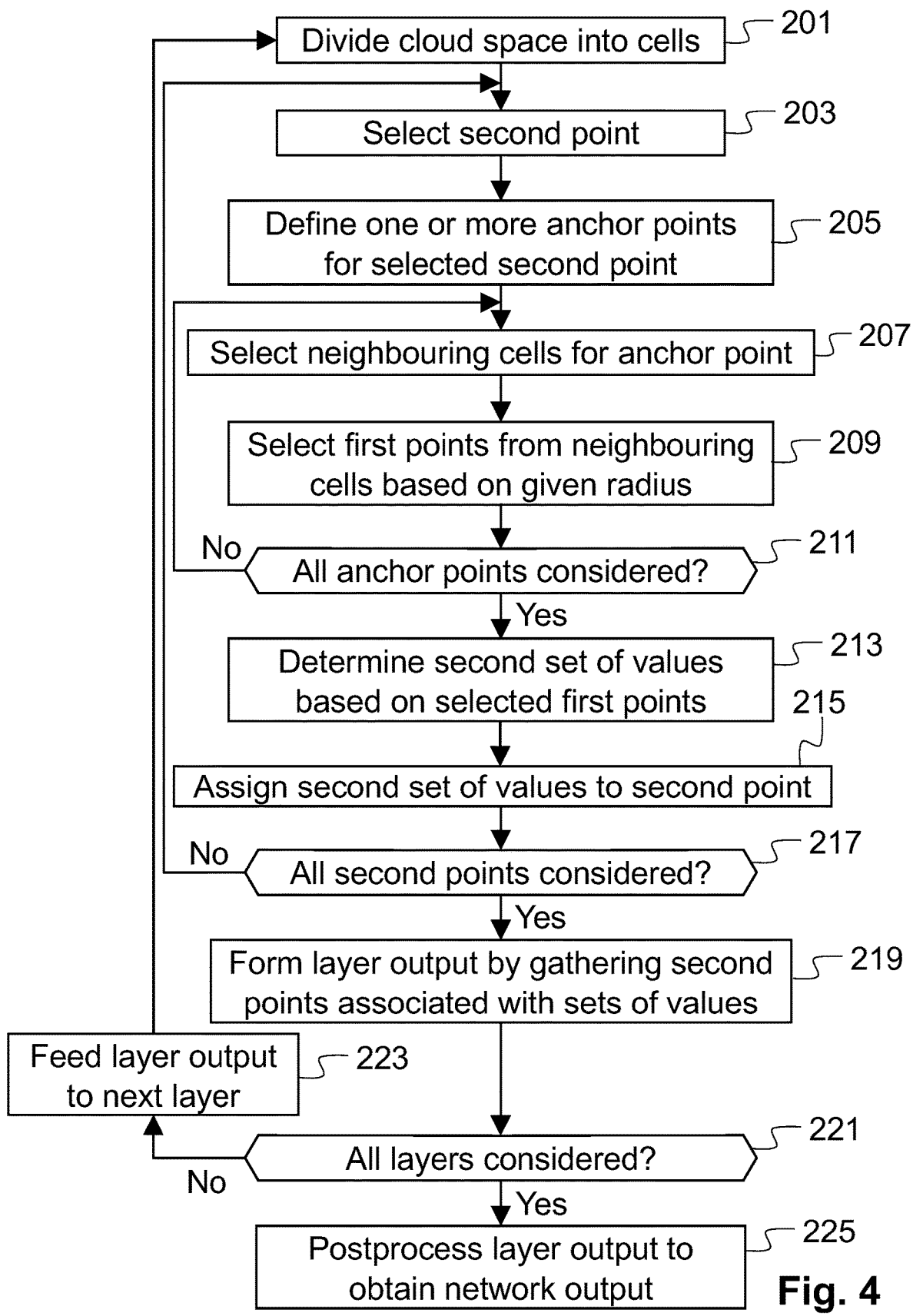
Figure 5:
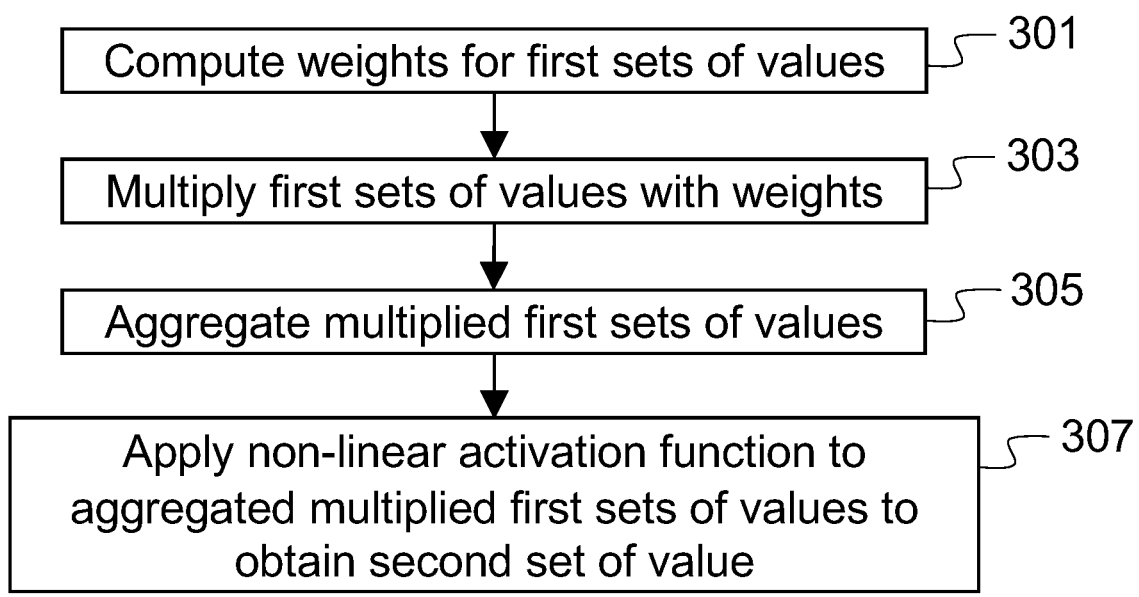

The flowcharts of FIGS. 3 to 5 further describe the above computer-implemented method in a trained artificial neural network of projecting a first data set comprising a first set of points comprising first points in a metric space, and associated first sets of values, to a second data set comprising a second set of points comprising second points, and associated second sets of values. Referring to the flowchart of FIG. 3, in step 101, a first point cloud or a first set of points comprising first points, first features associated with the first points, and a second point cloud or a second set of points comprising second points, are defined or determined. The first data set may optionally comprise additional features or data, not associated with any specific points (i.e., a set of scalars), such an angle of attack of a wing. In step 103, the first and second point clouds, or more specifically the locations of the first points 11 and second points 13, together with the associated first sets of values and optionally the additional data are fed as input data into the NN 3. In step 105, the NN 3 processes the input information. In other words, the NN is applied to the input data. The processing steps are explained in more detail with reference to the flowchart of FIG. 4. The subsequent steps, namely steps 107 and 109, are optional, and there are many alternative ways to use the results of step 105. In the following, merely one possible way to process the outcome of step 105 is briefly explained. Once the NN has processed the input information, in step 107, gradients (i.e., derivatives) are determined with respect to the first point cloud geometry and/or the input features (the first features and/or the additional data). After this, in step 109, the first point cloud geometry and/or the input features are modified according to the gradients determined in step 107. It is to be noted that the steps 107 and 109 are in this example carried out by the NN. Other possibilities to implement steps 107 and 109 would be to output the outcome of step 105 directly or indirectly to the user, or to use the outcome of step 105 to categorise the NN input (e.g. by selecting good vs bad shapes, etc.).

The processing of step 105 carried out by the NN 3 is next explained in more detail with reference to the flowchart of FIG. 4. In step 201, the point space is divided into cells 17 as shown in FIG. 1. In this example, the point space is uniformly partitioned into equally sized and shaped cells 17 on a resulting grid. In this example, the cells are rectangles, and more specifically squares. In step 203, a second point is selected (e.g. randomly) out of the predefined set of second points. It is to be noted that the locations of the second points are predefined, for instance by the end user. In step 205, one or more anchor points 14 are defined for the selected second point 13. In this example, only one anchor point is defined for the selected second point so that its location coincides with the location of its associated second point. In step 207, neighbouring cells are determined or selected for the anchor point 14. Only the cells that satisfy a given first proximity condition with respect to the anchor point are selected to be part of the anchor point cell neighbourhood set. The first proximity condition depends on the distance of the cells to the anchor point. As explained earlier, the first proximity condition is in this example defined based on the query-ball drawn around the anchor point. In step 209, first points satisfying a given second proximity condition are selected from the anchor point cell neighbourhood set. As explained earlier, the second proximity condition is also defined based on the query-ball. More specifically, the second proximity condition depends on the radius of the query ball. Thus, all the cells that lie within the anchor point cell neighbourhood set and are within a distance of the query-ball radius from the anchor point are selected or retained for further processing.

In step 211, it is determined whether or not all the anchor points have been considered. If this is not the case, then the process in this example continues in step 207. If on the other hand all the anchor points have been considered, then in step 213, the second sets of values are determined for the second points. If there are more than one anchor point assigned to a respective second point, then in this step sets of values are first determined for the anchor points (anchor point values) associated with the respective anchor point before determining the respective second set of values for the respective second point. The manner how these sets of values can be determined was described earlier. In step 215, the determined second set of values is then assigned to the respective second point.

In step 217, it is determined whether or not all the second points of a respective layer of the NN have been considered. If this is not the case, then the process in this example continues in step 203. If on the other hand all the second points of the present layer have been considered, then in step 219, the output of the present layer is obtained by gathering the second points and their associated second sets of values. The layer output thus forms the second data set. The second set of data may represent a field of values or a set of fields, where a field characterises at least two second points 13. In other words, each set of values in the field may represent one second point. Alternatively, the second data set may be processed so that the second set of data represents a single scalar or a set of scalars. Thus, a single scalar would represent all the second points.

In step 221, it is determined whether or not all the layers of the NN have been considered. If this is not the case, then the process in this example continues in step 223, where the present layer output is fed into a subsequent layer in the NN 3. From step 223, the process continues in step 201. However, the process could instead continue in step 203, if there is no need to modify the grid (in other words the partition of the cells). If on the other hand all the layers have been considered, then the process continues in step 225, where layer output of the last layer is post-processed to obtain a network output data set. It is to be noted that step 225 is optional. Furthermore, it would also, or in addition, be possible to post-process individual layer outputs. Step 225 may be carried out by the NN itself of by the post-processing unit 9.

Step 213 of determining the second set of values for the respective second point 13 is next summarised with reference to the flowchart of FIG. 5 according to the present example, where only one anchor point 14 is assigned per respective second point, and where the second set of values is computed based on convolution. In step 301, weights are computed for the first sets of values, which are located within the query ball or satisfy another proximity condition with respect to the anchor point. In this example, the weights are determined based on a filter value, which depends on relative locations of a respective first point and a respective second point and/or a specific anchor point used to select the respective first point and/or on pre-trained values. In other words, the filter values applied to the first sets of values may be a function of 1) the relative locations of the second point and/or anchor point and/or centroid, and/or 2) pre-trained values which have been determined during the training process. The pre-trained values are often called the parameters (or parameter set) of the layer (e.g. height and width of the gaussian filters). It is to be noted that the parameters or the pre-trained values may also comprise learned positions of some gaussian (or other) filters, which may in this context be called centroids. The locations of the centroids may thus be learned during a training phase, and the above filter value may optionally (also) depend on the centroid. It may be the case that these gaussian centroids correspond to the anchor points (this would be a smart way of choosing the anchor points). But it may also be the case that the second point is taken as the only anchor point, and still there would be several gaussian centroids for the filters which do not coincide with the location of the second point. In essence, in all cases, we would typically have these filter centroids and other values that have a given relationship (often learned) with the second point. This is the definition of the convolution layer. Then to make it efficient (i) sometimes a spatial selection is carried out based on the second point itself, and a radius large enough is taken so that it contains (or is likely to contain) all the centroids, or (ii) sometimes the centroids may be directly used as anchor points which allow us to select first points in a more targeted way around the centroids, and make sure no centroids are missed.

In step 303, the first sets of values are multiplied with the weights. In step 305, the first sets of values are aggregated by for instance summing them or by using any other of the techniques explained above. Then in step 307, a non-linear activation function is optionally applied to the set of values obtained in step 305 to obtain the second set of values for the second point.

It is to be noted that the flowcharts 3 and 5 give merely one example of implementing the teachings of the present invention, which allow extracting information from the first data set comprising the first set of points in a metric space using a trained neural network. For instance, the precise implementation of each or at least some of the layers of the NN 3 may not be the same. In other words, regarding the operation of the different layers, there may be some differences between the different layers.

The above described method may be carried out by suitable circuits or circuitry, which are part of the NN 3. The terms "circuits" and "circuitry" refer to physical electronic components or modules (e.g. hardware), and any software and/or firmware ("code") that may configure the hardware, be executed by the hardware, and or otherwise be associated with the hardware. The circuits may thus be configured or operable to carry out or they comprise means for carrying out the required method as described above.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A computer-implemented method in a trained artificial neural network for projecting a first data set comprising a first set of points comprising first points in a metric space to a second data set comprising a second set of points comprising second points, the first points being associated with at least first sets of values, the method comprising:
- dividing the metric space into cells such that the first points belong to one or more of the cells;
- defining at least one anchor point for a respective second point;
- selecting cells which satisfy a given proximity condition with respect to a respective anchor point;
- selecting, out of the selected cells, the first points which are within a first distance from the respective anchor point;
- determining a respective second set of values for the respective second point based on the first sets of values associated with the selected first points; and
- forming the second data set by associating at least some of the determined respective second sets of values with the second points so that one second set of values is allocated per one second point,
- wherein the respective second set of values for the respective second point is computed by applying a pre-trained layer of the trained neural network to the first sets of values associated with the selected first points, and
- wherein applying the pre-trained layer of the trained neural network to the first sets of values consists of applying weights to the first sets of values, wherein the weights are a function of pre-trained values which have been determined during the training process, wherein the weights comprise the height, width and/or positions of spatial filters, the spatial filters depending on relative locations of a respective first point and the respective second point and/or the respective anchor point.

2. The method according to claim 1, wherein the first set of points represents a two-dimensional or a three-dimensional shape.

3. The method according to claim 1, wherein the first values are calculated by a subset of the trained neural network.

4. The method according to claim 1, wherein applying the layer of the trained neural network layer comprises:
- aggregating the first sets of values associated with the selected first points to obtain the respective second set of values or a respective anchor point value if more than one anchor point is defined for the respective second point; and
- aggregating the anchor point values, and associating the aggregated anchor point values with the respective second point; or associating the respective second set of values with the respective second point.

5. The method according to claim 1, wherein applying the layer of the trained neural network comprises:
- for each selected first point multiplying the first sets values associated with the selected first points with a filter value, which depends on relative locations of a respective first point and the respective second point and/or a specific anchor point used to select the respective first point, and/or on a parameter set of the layer; and
- aggregating the multiplied first sets of values associated with the selected first points to obtain the respective second set of values or a respective anchor point value if more than one anchor point is defined for the respective second point.

6. The method according to claim 4, wherein the aggregation is implemented by one of the following operations: taking the sum of the first sets of values or the multiplied first sets of values; taking an average of the first sets of values or the multiplied first sets of values; selecting the largest of the first sets of values or the multiplied first sets of values; and selecting the smallest of the first sets of values or the multiplied first sets of values.

7. The method according to claim 1, wherein the cells form a regular grid.

8. The method according to claim 1, wherein the cells form a grid, and wherein at least some of the cells overlap or partially overlap with one or more other cells in the grid.

9. The method according to claim 1, wherein the cells are selected by comparing a distance of the respective anchor point to all or a subset of the cells.

10. The method according to claim 1, wherein the cells are selected by defining a respective query ball around a respective anchor point in the metric space so that the respective anchor point is centred within the respective query ball, and so that only the cells which overlap with the respective query ball or a bounding box around the respective query ball are selected.

11. The method according to claim 1, wherein the cells are selected by allocating indices to the cells and selecting the cells having a given proximity relationship with a respective anchor point index determined by its location coordinate in the metric space.

12. The method according to claim 1, wherein the method further comprises processing the second data set to obtain a post-processed second data set.

13. The method according to claim 1, wherein the trained neural network comprises a number of convolutional layers and/or filters and/or non-linear functions configured to be applied in sequence.

14. The method according to claim 1, wherein the trained neural network is trained such that the trained neural network provides an accurate estimation of given experimental and/or simulated quantities when applied to given training data, wherein the given experimental and/or simulated quantities have been pre-computed by an external experiment and/or simulation.

15. The method according to claim 1, wherein the second set of data is processed so that the second set of data represents a single scalar or a set of scalars.

16. The method according to claim 1, wherein the second set of data represents a field or a set of fields, where a field characterises at least two second points.

17. The method according to claim 1, wherein the second set of data comprises a physical quantity or an estimation thereof relating to an object represented by the second set of points.

18. The method according to claim 17, wherein the physical quantity or an estimation thereof comprises information relative to at least one of the following: aerodynamics, pressure, velocity, drag, structural mechanics, displacement, and stress.

19. The method according to claim 1, wherein method further comprises outputting the second set of data or a part of it to a user via a user interface.

20. The method according to claim 1, wherein the method further comprises using derivatives of the second set of data with respect to the first set of data to optimise locations of the first points and/or the first sets of values associated with the first points and/or additional data comprised in the first data set.

21. The method according to claim 1, wherein second locations of the second points in the metric space:
- are equal to first locations of the first points;
- coincide with some first locations of the first points;

form a subset of the first locations of the first set of points; form a superset of the first locations of the first points; or are distinct from the first locations of the first points.

22. The method according to claim 1, wherein anchor locations of the at least one anchor point coincide with second locations of the associated second points, or the anchor locations of the at least one anchor point are different from the second locations of the associated second points, but they bear a particular spatial relationship with the associated second points.

23. A trained artificial neural network comprising a graphics processing unit (GPU) for projecting a first data set comprising a first set of points comprising first points in a metric space to a second data set comprising a second set of points comprising second points, the first points being associated with at least first sets of values, the trained artificial neural network being configured to:
 divide the metric space into cells such that the first points belong to one or more of the cells;
 define at least one anchor point for a respective second point;
 select cells which satisfy a given proximity condition with respect to a respective anchor point;
 select, out of the selected cells, the first points which are within a first distance from the respective anchor point;
 determine a respective second set of values for the respective second point based on the first sets of values associated with the selected first points; and
 form the second data set by associating at least some of the determined respective second sets of values with the second points so that one second set of values is allocated per one second point,
 wherein the respective second set of values for the respective second point is computed by applying a pre-trained layer of the trained neural network to the first sets of values associated with the selected first points, and
 wherein applying the pre-trained layer of the trained neural network to the first sets of values consists of applying weights to the first sets of values, wherein the weights are a function of pre-trained values which have been determined during the training process, wherein the weights comprise the height, width and/or positions of spatial filters, the spatial filters depending on relative locations of a respective first point and the respective second point and/or the respective anchor point.

24. The method according to claim 1, wherein the spatial filters are gaussian filters.

* * * * *